(12) United States Patent
Miyamoto et al.

(10) Patent No.: US 11,892,479 B2
(45) Date of Patent: Feb. 6, 2024

(54) INTERFERENCE TYPE OPTICAL MAGNETIC FIELD SENSOR DEVICE

(71) Applicants: CITIZEN FINEDEVICE CO., LTD., Yamanashi (JP); CITIZEN WATCH CO., LTD., Tokyo (JP); Shinshu University, Nagano (JP)

(72) Inventors: Mitsunori Miyamoto, Nagano (JP); Toshiya Kubo, Nagano (JP); Toshiroh Sato, Nagano (JP); Makoto Sonehara, Nagano (JP)

(73) Assignees: CITIZEN FINEDEVICE CO., LTD., Yamanashi (JP); CITIZEN WATCH CO., LTD., Tokyo (JP); SHINSHU UNIVERSITY, Nagano (JP)

( * ) Notice: Subject to any disclaimer, the term of this patent is extended or adjusted under 35 U.S.C. 154(b) by 0 days.

(21) Appl. No.: 17/627,118

(22) PCT Filed: Mar. 31, 2020

(86) PCT No.: PCT/JP2020/014925
§ 371 (c)(1),
(2) Date: Jan. 13, 2022

(87) PCT Pub. No.: WO2021/019839
PCT Pub. Date: Feb. 4, 2021

(65) Prior Publication Data
US 2022/0268818 A1 Aug. 25, 2022

(30) Foreign Application Priority Data

Jul. 31, 2019 (JP) .................................. 2019-141404

(51) Int. Cl.
*G01R 15/24* (2006.01)
*G01R 33/032* (2006.01)

(52) U.S. Cl.
CPC ....... *G01R 15/246* (2013.01); *G01R 33/0322* (2013.01)

(58) Field of Classification Search
CPC .............. G01R 15/246; G01R 33/0322; G01R 33/0005; G01R 33/0029
(Continued)

(56) References Cited

U.S. PATENT DOCUMENTS 5,202,629 A * 4/1993 Seike .................... G01R 15/245
250/227.21
5,206,924 A 4/1993 Kersey
(Continued)

FOREIGN PATENT DOCUMENTS

CA 2515409 A1 5/2003
GB 2582793 A * 10/2020 ........... G01R 33/022
(Continued)

OTHER PUBLICATIONS

WIPO, International Search Report for International Patent Application No. PCT/JP2020/014925, dated Jul. 7, 2020.
(Continued)

*Primary Examiner* — Christopher P McAndrew

(57) ABSTRACT

A magnetic field sensor element 1 includes a light emitter 10 emitting a first linearly polarized light, a first optical element 20 emitting a first linearly polarized wave and the second linearly polarized wave in response to a first linearly polarized light incident, and emitting a second linearly polarized light in response to a third linearly polarized wave and the a linearly polarized wave incident, at least one pair of magnetic field sensor elements 50 capable of disposing in a predetermined magnetic field across the measured conductor, having a light transmissive, changing the phase of transmitted light in accordance with the magnetic field, and fixing a relative position therebetween, an optical path 30
(Continued)

including a first optical path propagating the first linearly polarized wave and the fourth linearly polarized wave, and a second optical path propagating the second linearly polarized wave and the third linearly polarized wave, and connected to the first optical element and the magnetic field sensor element, a detected signal generator 60 outputting a detected signal corresponding to the magnetic field, by receiving two components of the second linearly polarized light, and converting to the electrical signal, and an optical branching element transmitting the first linearly polarized light to the first optical element and branching the second linearly polarized light to the detected signal generator.

5 Claims, 10 Drawing Sheets

(58) Field of Classification Search
 USPC .......................................................... 324/96
 See application file for complete search history.

(56) References Cited

U.S. PATENT DOCUMENTS

| 2012/0218555 A1 | 8/2012 | Kumagai et al. |
| 2015/0369954 A1 | 12/2015 | Jaaskelainen et al. |
| 2017/0343621 A1* | 11/2017 | Hahn ................. G01R 33/1284 |
| 2020/0309869 A1 | 10/2020 | Kubo et al. |
| 2022/0003826 A1* | 1/2022 | Ohodnicki ........... G01R 33/091 |

FOREIGN PATENT DOCUMENTS

| JP | S60-57276 A | 4/1985 |
| JP | S64-91078 A | 4/1989 |
| JP | H11-337592 A | 12/1999 |
| JP | 2000-266784 A | 9/2000 |
| JP | 2011-69700 A | 4/2011 |
| JP | 2011-158337 A | 8/2011 |
| JP | 2017-15576 A | 1/2017 |
| JP | 2018-28499 A | 2/2018 |
| JP | 2019-148442 A | 9/2019 |
| WO | 2019/066050 A1 | 4/2019 |

OTHER PUBLICATIONS

WIPO, Written Opinion for International Patent Application No. PCT/JP2020/014925, dated Jul. 7, 2020.
Tamura Hitoshi et al., "Ring Interferometric Magnetic Field Optical Sensor Using a Garnet Single Crystal", Journal of the Magnetics Society of Japan vol. 34, No. 4, 2010.
EPO, Extended European Search Report for European Patent Application No. 20847499.9-1212, dated Jul. 24, 2023.

* cited by examiner

INTERFERENCE TYPE OPTICAL MAGNETIC FIELD SENSOR DEVICE

FIELD

The present disclose relates to an interference type optical magnetic field sensor device.

BACKGROUND

An interference type optical magnetic field sensor device is known that uses a probe type sensor provided with a Faraday rotator at an optical fiber tip as a magnetic field sensor element, and generates a detected signal corresponding to the magnetic field applied to the Faraday rotator by photoelectric converting light transmitted through the magnetic field sensor element (e.g., "Ring Interferometric Magnetic Field Optical Sensor Using a Garnet Single Crystal" (Tamura Hitoshi et al., see Journal of the Magnetics Society of Japan Vol 34, No. 4, 2010)). In the sensor device described in the document, a magnetic field perpendicular to the magnetic field sensor element may be measured in addition to a magnetic field parallel thereto, by using a rare earth iron garnet crystal (TbY) IG as a Faraday rotator.

A phase noise detection probe is described in JP2000-266784 in which a plurality of near magnetic field probes consisting of a loop coil and a transmission path are disposed with respect to the center line of a measured cable so as to eliminate an influence of external noise. A current sensor is described in JP 2011-158337 that has two magnetic sensors symmetrically disposed across a measured current path so that when one of the magnetic sensors fails, the other magnetic sensor measures the current.

SUMMARY

In the sensor device in which a magnetic field sensor element is disposed only one side of the current path of a measured object, the detected magnetic field amount varies by a distance between the magnetic field sensor element and a measured conductor. In such a sensor device, since only one point on a side of the measured conductor may be measured, even when the magnetic field sensor element is fixed with respect to the measured conductor, a magnetic field generated around the conductor may not be accurately measured. Although when the measured conductor is surrounded by a magnetic yoke, a magnetic field around a measured conductor may be measured, when the magnetic yoke is made of a ferrite magnetic material, the upper limit of the measurable frequency is about 1 MHz, and therefore a current having a frequency higher than the upper limit may not be measured.

The object of the present disclosure is to provide an interference type optical magnetic field sensor device in which measured values are independent from a distance to the measured conductor, and high frequency currents may be measured.

An interference type optical magnetic field sensor device is provided that includes a light emitter emitting a first linearly polarized light, a first optical element emitting a first linearly polarized wave and a second linearly polarized wave in response to a first linearly polarized light incident, and emitting a second linearly polarized light in response to a third linearly polarized wave and the a linearly polarized wave incident, at least one pair of magnetic field sensor elements capable of disposing in a predetermined magnetic field across the measured conductor, having a light transmissive, changing the phase of transmitted light in accordance with the magnetic field, and fixing a relative position therebetween, an optical path including a first optical path propagating the first linearly polarized wave and the fourth linearly polarized wave, and a second optical path propagating the second linearly polarized wave and the third linearly polarized wave, and connected to the first optical element and the magnetic field sensor elements, a detected signal generator outputting a detected signal corresponding to the magnetic field, by receiving two components of the second linearly polarized light, and converting to the electrical signal, and an optical branching element transmitting the first linearly polarized light to the first optical element and branching the second linearly polarized light to the detected signal generator, wherein when the first linearly polarized wave is incident on one of the magnetic field sensor elements, the one emits first return light, and when second return light is incident on one of the magnetic field sensor elements the one emits the fourth linearly polarized wave, and when the first return light is incident on the other of the magnetic field sensor elements, the other emits the third straight line polarized wave, and when the second linearly polarized wave is incident on the magnetic field sensor element, the other emits the second return light.

It is preferable that the optical path further includes a second optical element disposed in the second optical path, and adjusting the phase of the second linearly polarized wave and the third linearly polarized wave so that the phase difference between the third linearly polarized wave and the fourth linearly polarized wave is 90 degrees.

It is preferable that the first optical element is a ½ wave plate disposed so that the polarization plane azimuth angle of the first linearly polarized light is 22.5 degrees, and the detected signal generator receives the second linearly polarized light incident from the optical branching element, and separates the second linearly polarized light into S polarization component light and P polarization component.

It is preferable that the first optical element is a coupler configured to emit the first linearly polarized light by separating the first linearly polarized wave into a first linearly polarized wave, and the second linearly polarized light, and emitting the second linearly polarized light, by separating the second linearly polarized light into the two components, and one of the two components is incident from the first optical element to the detected signal generator, and the other of the two components are incident from the optical branching element to the detected signal generator.

It is preferable that the light emitter, the optical branching element, the first optical element, the optical path, the magnetic field sensor element and the detected signal generator are connected to each other by polarization maintaining fibers.

In the above interference type optical magnetic field sensor device, the measured value is independent from a distance to a measured conductor and a high frequency current may be measured.

DESCRIPTION OF EMBODIMENTS

Hereinafter, with reference to the drawings will be described interference type optical magnetic field sensor device. However, that the technical scope of the present invention is not limited to those embodiments, but spans the claimed invention and its equivalents.

Figure 1:
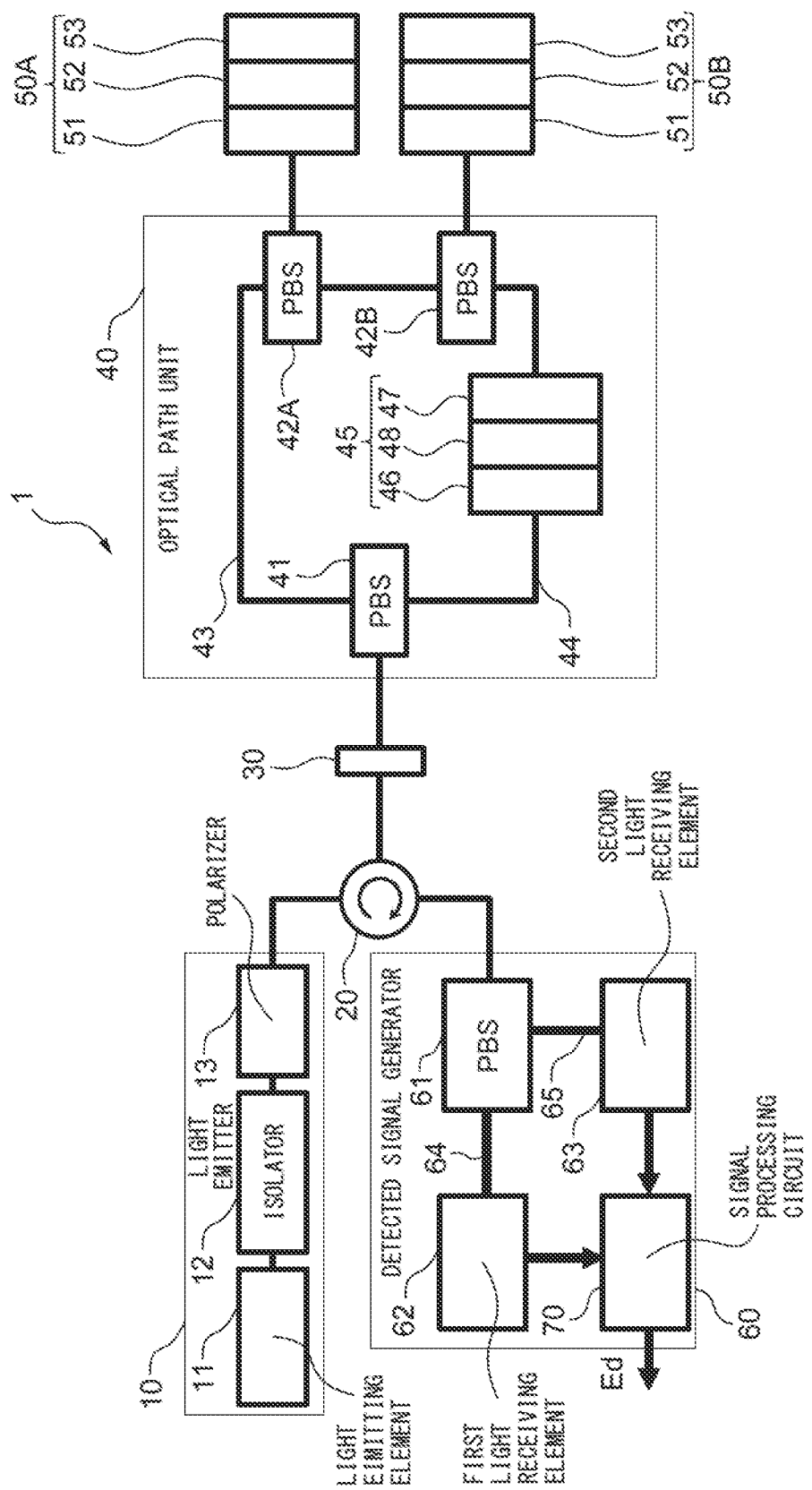
FIG. 1 is a block diagram of the sensor device 1.

FIG. 1 is a block diagram of the sensor device 1. The sensor device 1 is an example of an interference type optical magnetic field sensor device, and includes a light emitter 10, a circulator 20, a ½ wave plate 30, an optical path 40, a magnetic field sensor elements 50A and 50B and a detected signal generator 60. The light paths among light emitter 10, the circulator 20, ½ wave plate 30, the optical path 40, the magnetic field sensor elements 50A and 50B and the detected signal generator 60 are formed by PANDA (Polarization-maintaining AND Absorption-reducing) fibers. The light paths among the ½ wave plate 30, the optical path 40, the magnetic field sensor elements 50A and 50B, and the detected signal generator 60 may be formed by polarization-maintaining fibers such as bow-tie fiber or elliptical jacket fiber.

The light emitter 10 includes a light emitting element 11, an isolator 12, and a polarizer 13. The light emitting element 11 is preferably, for example, a semiconductor laser or a light emitting diode, specifically, Fabry-Perot laser, a super luminescent diode and etc. The isolator 12 transmits light emitted from the light emitting element 11 to the circulator 20 side, and protects the light emitting element 11 by not transmitting light incident on the light emitter 10 from the circulator 20 to the light emitting element 11 side. The isolator 12 is, for example, a polarization-dependent optical isolator, and may be a polarization-independent optical isolator. The polarizer 13 is an optical element configured to change the light emitted from the light emitting element 11 to linearly polarized light, the type thereof is not particularly limited. The first linearly polarized light obtained by the polarizer 13 is incident on the circulator 20.

The circulator 20 is an example of an optical branching element, transmits the first linearly polarized light emitted from the light emitter 10 to the ½ wave plate 30, branches a second linearly polarized light emitted from the ½ wave plate 30 to the detected signal generator 60. The circulator 20 is formed by, for example, a Faraday rotator, a ½ wave plate, a polarizing beam splitter or a reflecting mirror.

The ½ wave plate 30 is an example of a first optical element, is disposed so that an azimuth angle thereof is 22.5 degrees with respect to a polarization plane of the first linearly polarized light incident from the circulator 20, and rotates the polarization plane of the first linearly polarized light by 45 degrees and emits the first linearly polarized light to the optical path 40. The first linearly polarized light emitted from the ½ wave plate 30 has a first linearly polarized wave CW1 which is P-polarized light, and a second linearly polarized wave CCW1 which is S-polarized light orthogonal to the first linearly polarized wave CW1. The ½ wave plate 30 emits the second linear polarization light to the circulator 20 by rotating the polarizing surface of the second linear polarization incident from the light path portion 40 by 45 degrees.

The optical path 40 includes PBSs (polarizing beam splitter) 41, 42A and 42B, a first optical path 43, a second optical path 44 and a phase adjusting element 45.

The PBS 41 separates the first linearly polarized light incident from the ½ wave plate 30 to the P polarization component and the S polarization component, emits the first linearly polarized wave CW1 to the first optical path 43, and emits the second linearly polarized wave CCW1 to the second optical path 44, respectively. Further, the third straight line polarized wave CW2 is incident from the second optical path 44 to the PBS 41, and the fourth linearly polarized wave CCW2 is incident from the first optical path 43 to the PBS 41, and the PBS 41 synthesizes the third straight line polarized wave CW2 and he fourth linearly polarized wave CCW2, and emits light synthesizing the third straight line polarized wave CW2 and the fourth linearly polarized wave CCW2 to the ½ wave plate 30. The third straight line polarized wave CW2 and the fourth linearly polarized wave CCW2 are polarization components of the second linearly polarized light orthogonal to each other, and emitted to the ½ wave plate 30. Although the PBSs 41, 42A and 42B is, for example, a prismatic beam splitter, the PBSs 41, 42A and 42B may be a planar beam splitter or a wedge beam splitter.

The PBS 42A emits a first linearly polarized wave CW1 incident from the first optical path 43 to the magnetic field sensor element 50A, and emits return light of the first linearly polarized wave CW1 from the magnetic field sensor element 50A to the PBS 42B. Further, the PBS 42A emits return light from the magnetic field sensor element 50B incident from the PBS 42B to the magnetic field sensor element 50A, and emits return light of the return light from the magnetic field sensor element 50A as a fourth straight line polarized wave CCW2 to the first optical path 43. The PBS42B emits a second linearly polarized wave CCW1 incident from the second optical path 44 to the magnetic field sensor element 50B, and emits return light of the second linearly polarized wave CCW1 from the magnetic field sensor element 50B to the PBS42A. Further, the PBS 42B emits return light from the magnetic field sensor element 50A incident from the PBS 42A to the magnetic field sensor element 50B, and emits return light of the return light from the magnetic field sensor element 50B as a third straight line polarized wave CW2 to the second optical path 44.

The first optical path 43 is a PANDA fiber, one end thereof is optically connected to the PBS 41 and the other end thereof is optically connected to the PBS 42A, and derives the first linearly polarized wave CW1 introduced from the PBS 41 to the PBS 42A, and derives the fourth linearly polarized wave CCW2 introduced from the PBS 42A to the PBS 41. The second optical path 44 is a PANDA fiber, one end thereof is optically connected to the PBS 41 and the other end thereof is optically connected to the PBS 42B, the second optical path 44 derives the second linearly polarized wave CCW1 introduced from the PBS 41 to the PBS 42B, derives the third linearly polarized wave CW2 introduced from the PBS 42B to the PBS 41. The optical path between the PBS42A and 42B is a PANDA fiber. The optical paths among first optical path 43, the second optical path 44 and the PBSs 42A and 42B may be a polarization maintaining fiber such as a bow-tie fiber or elliptical jacket fiber.

The phase adjusting element 45 includes ¼ wave plates 46 and 47 and a 45 degrees Faraday rotator 48. The phase adjusting element 45 is an example of a second optical element, is disposed in the second optical path 44, and adjusts the phase of the second linearly polarized wave CW2 and the third linearly polarized wave CCW2 so that the phase difference between the third linearly polarized wave CCW1 and the fourth linearly polarized wave CCW2 is 90 degrees. The ¼ wave plate 46 is disposed so that the optical axis thereof is inclined by 45 degrees with respect to the slow axis and the phase advance axis of PANDA fibers forming the second optical path 44, changes linearly polarized light to circularly polarized light, and changes circularly polarized light to linearly polarized light. The ¼ wave plate 47 is disposed so that the optical axis thereof is inclined by −45 degrees with respect to the slow axis and the phase advance axis of PANDA fibers forming the second optical path 44, changes circularly polarized light to linearly polarized light, and changes linearly polarized light to circularly polarized light.

The 45 degrees Faraday rotator 48 is disposed between the ¼ wave plates 46 and 47 and changes the phases of the circularly polarized light incident therefrom. The 45 degrees Faraday rotator 48 changes a phase of incident light so that a phase of the second linearly polarized wave CCW1 emitted from the ¼ wave plate 47 is shifted by 45 degrees from a phase of the second linearly polarized wave CCW1 incident on the ¼ wave plate 46. The 45 degrees Faraday rotator 48 changes a phase of incident light so that the phase of the third linearly polarized wave CW2 emitted from the ¼ wave plate 46 is shifted −45 degrees from the phase of the third linearly polarized wave CW2 incident on the ¼ wave plate 47.

Figure 2:
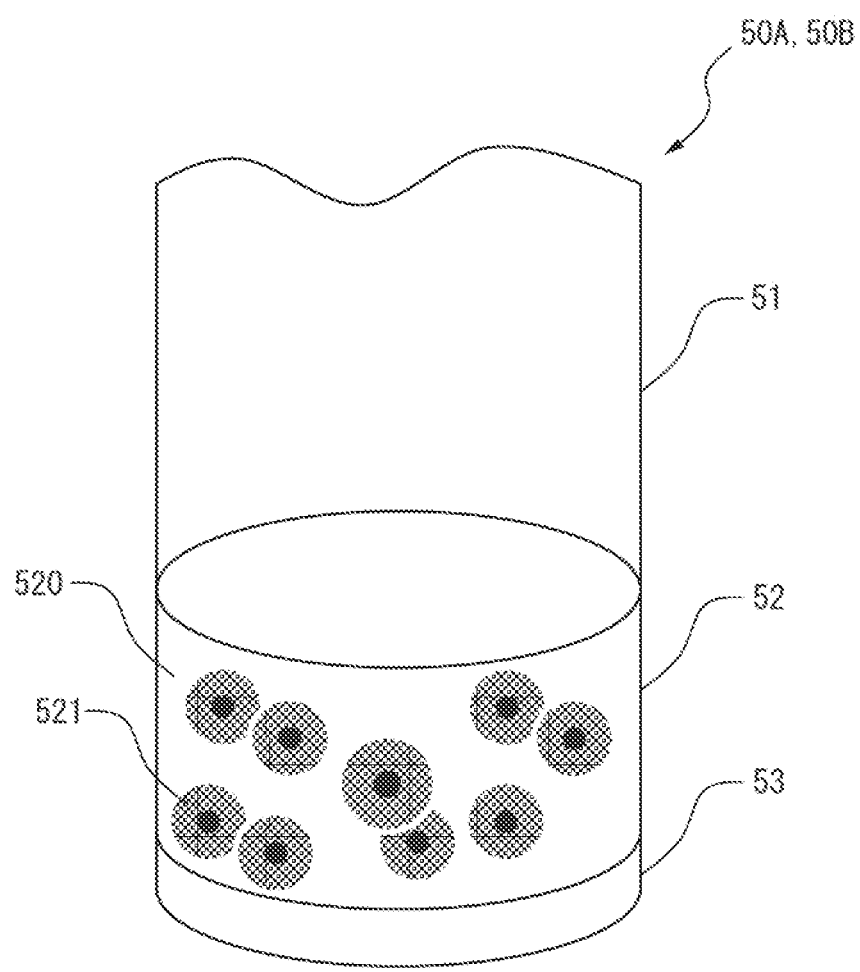
FIG. 2 is a schematic diagram of a magnetic field sensor elements 50A and 50B.

FIG. 2 is a schematic diagram of a magnetic field sensor elements 50A and 50B. The magnetic field sensor elements 50A and 50B are a pair of elements having the same configuration, both of the magnetic field sensor elements 50A and 50B include a ¼ wave plate 51, a Faraday rotator 52 and a mirror element 53. The magnetic field sensor element 50A is connected to the PBS 42A through a PANDA fiber, and the magnetic field sensor element 50B is connected to the PBS 42B through a PANDA fiber, respectively.

The magnetic field sensor elements 50A and 50B are capable of disposing in a predetermined magnetic field across a measured conductor (a current path indicated by reference numeral I in FIGS. 4 and 5), and are integrally formed at a constant distance from each other. A relative position of one of the magnetic field sensor elements 50A and 50B is fixed to the other thereof, and therefore a distance between the magnetic field sensor elements 50A and 50B is invariant, even if the magnetic field sensor elements 50A and 50B are moved during a measurement. The magnetic field sensor elements 50A and 50B have an optical transparency, and change a phase of transmitted light in response to a magnetic field applied to the Faraday rotator 52. The first linearly polarized wave CW1 is incident on the magnetic field sensor element 50A, and the magnetic field sensor element 50A emits a first return light in response to the incident light, and the second return light is incident from the magnetic field sensor element 50B, and emits a fourth linearly polarized wave CCW2 in response to the incident light. The first return light from the magnetic field sensor element 50A is incident on the magnetic field sensor element 50B, and the magnetic field sensor element 50B emits a third straight line polarized wave CW2 in response to the incident light, and the second linearly polarized wave CCW1 is incident on the magnetic field sensor element 50B, and the magnetic field sensor element 50B emits a second return light in response to the incident light.

The ¼ wave plate 51 is a ¼ wave plate that is disposed so that an optical axis thereof is inclined 45 degrees with respect to the slow axis and the phase advance axis of a PANDA fiber optically connected to the PBS 42A or the PBS 42B. The ¼ wave plate 51 changes from the polarization state of the incident light that is a linearly polarized light incident from the PBS 42A or the PBS 42B to circularly polarized light, and changes from the polarization state of the return light emitted from light the Faraday rotator 52 that is a circularly polarized light to linearly polarized light.

The Faraday rotator 52 is a granular film having a dielectric 520 and nano-order magnetic particles 521 dispersed in the dielectric 520 in a stably phase separation from the dielectric 520, and is disposed on the end face of the ¼ wave plate 51. Although oxide may be formed by the magnetic particles 521, for example, in a small portion of the outermost layer and etc., the magnetic particles 521 are dispersed alone in a thin film in the entire Faraday rotator 52 without making compounds with dielectric used as a binder. The distribution of the magnetic particles 521 in the Faraday rotator 52 may not be completely uniform, may be eccentrically located a little. If the dielectric 520 has high transparency and the magnetic particles 521 in the dielectric 520 has a size smaller than the wavelength of light, the Faraday rotator 52 has an optical transparency.

The faraday rotator 52 is not limited to a single layer, it may be a multilayer film in which the granular films and the dielectric films are alternately laminated. When granular films are multi-layered, multiple reflections are occurred in the granular films, and therefore a larger Faraday rotation angle is obtained.

The dielectric 520 is preferably fluoride (metallic fluoride) such as magnesium fluoride (MgF2), aluminum fluoride (AlF3), or yttrium fluoride (YF3) The dielectric 520 may also be an oxide such as tantalum oxide (Ta2O5), silicon dioxide (SiO2), titanium dioxide (TiO2), niobium pentoxide (Nb2O5), zirconium dioxide (ZrO2), hafnium dioxide (HfO2) and aluminum trioxide (Al2O3). For good phase separation of the dielectric 520 and the magnetic particles 521, fluoride is preferred over oxide, and magnesium fluoride having a high transmittance is particularly preferred.

The material of the magnetic particle 521 may be one that produces a Faraday effect, but is not particularly limited, as the material, iron (Fe) is a ferromagnetic metal, cobalt (Co) and nickel (Ni) and these alloys. The alloy of Fe, Co and Ni, for example, FeNi alloy, FeCo alloy, FeNiCo alloy, NiCo alloy. The Faraday rotation angle per unit length of Fe, Co and Ni is nearly two to three orders of magnitude larger than the magnetic garnet applied to conventional Faraday rotators.

The mirror element 53 is formed on the surface opposite to the ¼ wave plate 51 of the Faraday rotator 52, and reflects the light transmitted through the Faraday rotator 52 toward the Faraday rotator 52. As the mirror element 53, for example, silver (Ag) film, gold (Au) film, aluminum (Al) film or a dielectric multilayer film mirror or the like can be used. In particular, a high Ag film and corrosion resistance high Au film reflectivity is convenient on the film formation preferable. The thickness of the mirror element 53 may be any size that can secure a sufficient reflectance of 98% or more, and for example, in the case of an Ag film, it is preferable that the thickness be 50 nm or more and 200 nm or less. The Faraday rotation angle may be increased by reciprocating light in the Faraday rotator 52 using the mirror element 53.

The detected signal generator 60 includes a PBS 61, a first light receiving element 62, a second light receiving element 63 and a signal processing circuit 70. The detected signal generator 60 separates the second linearly polarized light branched by the circulator 20 into S polarization component 64 and P polarization component 65, and outputs a detected signal Ed corresponding to a magnetic field applied to the magnetic field sensor elements 50A and 50B, by converting the S polarization component 64 and P polarization component 65 into an electric signal by receiving the S polarization component 64 and P polarization component 65 and differential amplifying the electric signal. The PBS 61 is a polarizing beam splitter, such as a prismatic type, a planar type, a wedge-substrate type, or an optical waveguide type, and separates the second linearly polarized light branched by the circulator 20 into an S polarization component 64 and a P polarization component 65.

Figure 3:
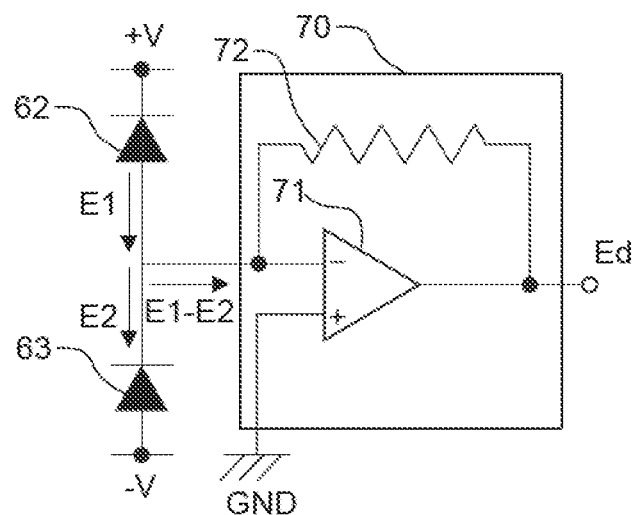
FIG. 3 is a circuit diagram of the first light receiving element 62, the second light receiving element 63 and the signal processing circuit 70.

FIG. 3 is a circuit diagram of the first light receiving element 62, the second light receiving element 63 and the signal processing circuit 70. The signal processing circuit 70 includes an amplifying element 71 that is, for example, an operational amplifier, and a resistor element 72.

Each of the first light receiving element 62 and the second light receiving element 63 is, for example, a PIN photodiode, and outputs an electrical signal corresponding to a received light amount by photoelectric conversion. The anode of the first light receiving element 62 and cathode of the second light receiving element 63 are connected to the negative input terminal of the amplifying element 71, the cathode of the first light receiving element 62 is connected to the positive power supply +V, the anode of the second light receiving element 63 is connected to the negative power supply −V. The first light receiving element 62 receives the S polarization component 64 of a synthesizing wave of the third straight line polarized wave CW2 and the fourth linearly polarized wave CCW2, and outputs a first electric signal E1 that is a current proportional to the intensity of the S polarization component 64. The second light receiving element 63 receives the P polarization component 65 of a synthesizing wave of the third straight line polarized wave CW2 and the fourth linearly polarized wave CCW2, and outputs a second electric signal E2 is a current proportional to the intensity of the P polarization component 65.

The S polarization component and the P polarization component of the third straight line polarized wave CW2 incident on the detected signal generator 60 are expressed by ECW of the following equation, and the S polarization component and the P polarization component of the fourth linearly polarized wave CCW2 are expressed by ECCW of the following equation. θF is a Faraday rotation angle corresponding to a magnetic field applied to the Faraday rotator 52, j is an imaginary unit.

[Formula 1]
$$E_{cw} = \frac{1}{\sqrt{2}} \begin{pmatrix} e^{j(4\theta_F - 45°)} \\ e^{j(4\theta_F - 45°)} \end{pmatrix}$$

$$E_{ccw} = \frac{1}{\sqrt{2}} \begin{pmatrix} e^{-j(4\theta_F + 135°)} \\ e^{-j(4\theta_F - 45°)} \end{pmatrix}$$

S polarization component P0 and P polarization component P90 of a synthesizing wave of the third straight line polarized wave CW2 and the fourth linearly polarized wave CCW2 is expressed by the following equation from the above ECW and ECCW equation. ECW,0,ECCW,0,ECW,90,ECCW,90 is S polarization component of the third straight line polarized wave CW2, S polarization component of the fourth linearly polarized wave CCW2, P polarization component of the third linearly polarized wave CW2, P polarization component of the fourth linearly polarized wave CCW2, respectively.

[Formula 2]

$$P_0 = |E_{CW,0} + E_{CCW,0}|^2 \alpha \sin^2(4\theta_F - 45°) \quad (1)$$

$$P_{90} = |E_{CW,90} + E_{CCW,90}|^2 \alpha \cos^2(4\theta_F - 45°) \quad (2)$$

The signal processing circuit 70 is an inverting amplifier circuit, by inverting and amplifying the differential signal (E1−E2) between the first electric signal E1 and the second electric signal E2, and outputs a detected signal Ed corresponding to a magnetic field applied to the magnetic field sensor elements 50A and 50B. A positive input terminal of the amplifier element 71 is grounded, a differential signal (E1−E2) is input to the negative input terminal of the amplifier element 71. The differential signal (E1−E2) is an electric signal proportional to the difference between the S polarization component P0 and the P polarization component P90, and corresponding to the Faraday rotation angle θF. The detected signal Ed is an electrical signal from which a DC component corresponding to the reference light intensity is removed.

Figure 4:
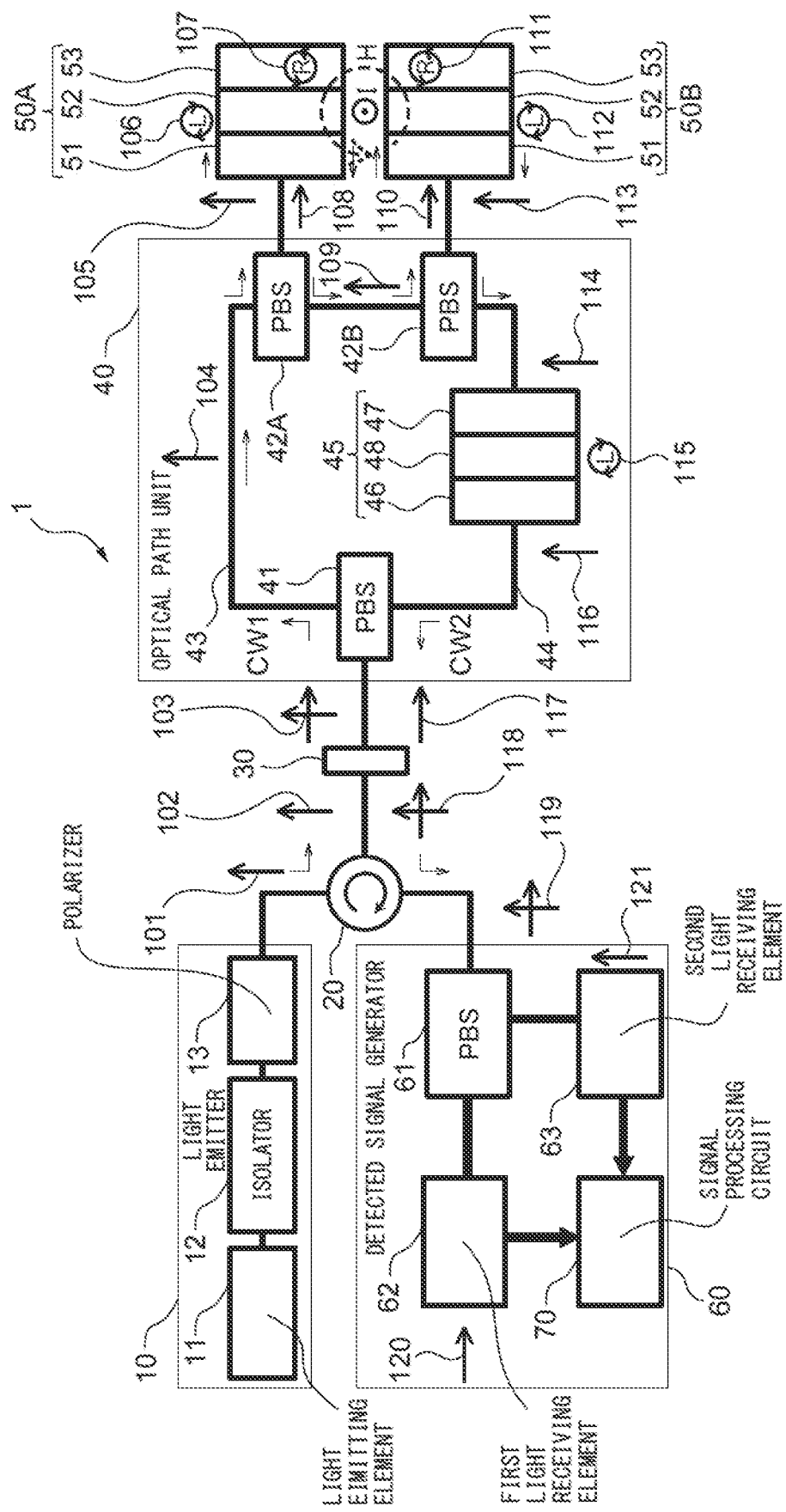
FIG. 4 is diagrams for explaining the operations of the sensor device 1.
Figure 5:
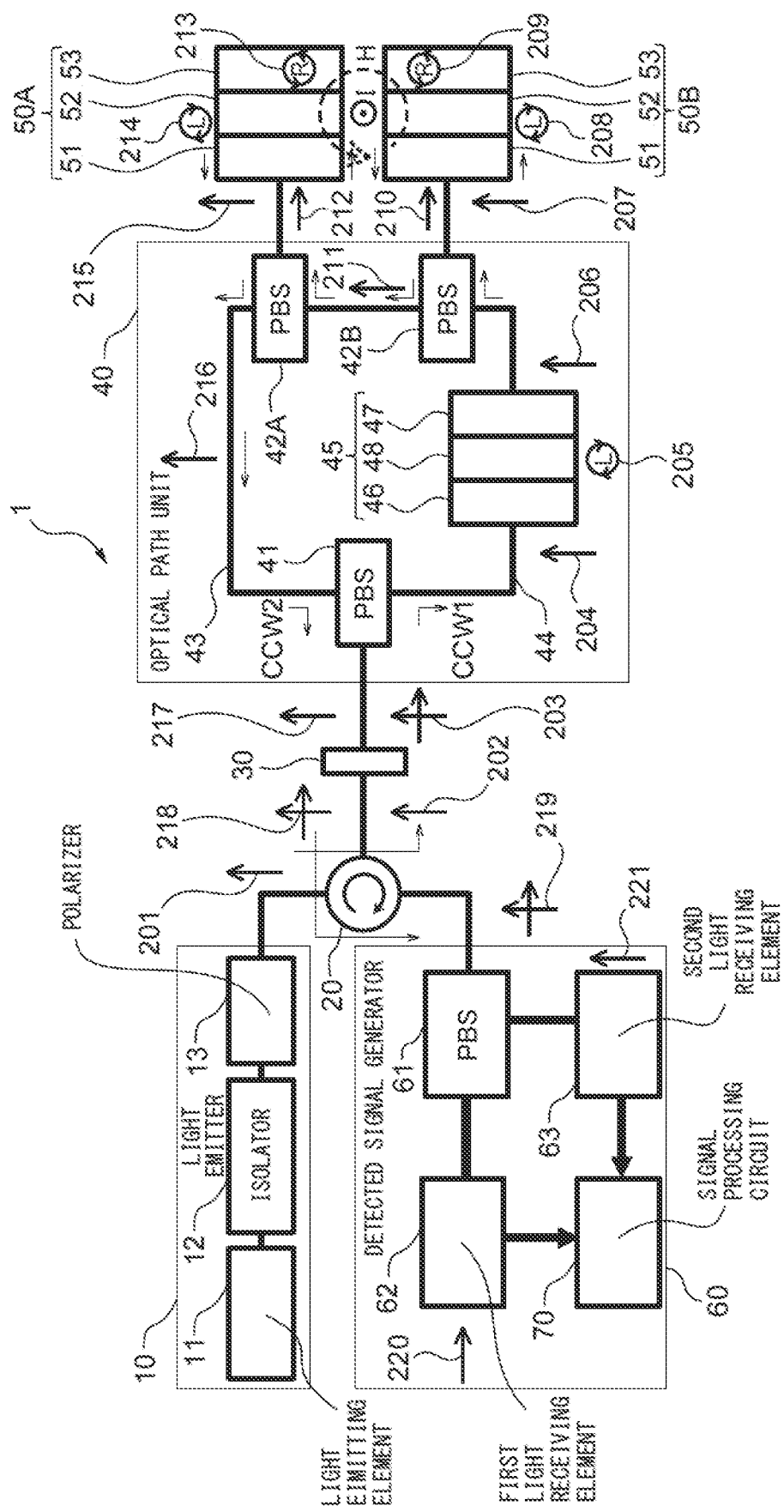
FIG. 5 is diagrams for explaining the operations of the sensor device 1.

FIGS. 4 and 5 are diagrams for explaining the operations of the sensor device 1. The thin arrows in FIGS. 4 and 5 indicate directions of light propagations, and the thick arrows 101 to 121 in FIG. 4, and the thick arrows 201 to 221 in FIG. 5 indicate polarization states at each location. Reference numeral I denotes a current flowing through a measured conductor, reference numeral H denotes a measured magnetic field.

First, a first linearly polarized light which is P-polarized light is emitted from the polarizer 13 of the light emitter 10 (directions of arrows 101 and 201), and the first linearly polarized light is transmitted through the circulator 20 and is incident on the ½ wave plate 30 (arrows 102 and 202). A polarization plane of the first linearly polarized light is rotated by 45 degrees, by transmitting through the ½ wave plate 30, and therefore the first linearly polarized light has a first linearly polarized wave CW1 which is P-polarized light and a second linearly polarized wave CCW1 which is S-polarized light (arrows 103 and 203).

The first linearly polarized wave CW1 is incident on the first optical path 43 through the PBS 41 (direction of arrow 104), and is incident on the magnetic field sensor element 50A through the PBS 42A (arrow 105). The first linearly polarized wave CW1 incident on the magnetic field sensor element 50A is changed to left rotating circularly polarized light by transmitting through the ¼ wave plate 51 (direction of arrow 106), the phase in accordance with a measured magnetic field H is changed by −θF, by transmitting through the Faraday rotator 52, and the first linearly polarized wave CW1 is changed to right rotating circularly polarized light by reflecting on the mirror element 53 (arrow 107), the phase in accordance with the measured magnetic field H is further changed by −θF, by transmitting through the Faraday rotator 52, the right rotating circularly polarized light is changed to S-polarized light by transmitting through the ¼ wave plate 51 again, and the S-polarized light is emitted to the PBS 42A (arrow 108). The total phase shift at the magnetic field sensor element 50A is −2θF.

Return light from the magnetic field sensor element 50A is changed to a P-polarized light through the PBS 42A (direction of arrow 109), the P-polarized light is changed to S-polarized light again through the PBS 42B, and the S-polarized light is incident on the magnetic field sensor element 50B (arrow 110). The S-polarized light incident on the magnetic field sensor element 50B is changed to right rotating circularly polarized light by transmitting through the ¼ wave plate 51 (direction of arrow 111), the phase in accordance with a measured magnetic field H is changed by −θF, by transmitting through the Faraday rotator 52, the right rotating circularly polarized light is changed to left rotating circularly polarized light by reflecting by the mirror element 53 (arrow 112), the phase in accordance with the magnetic field to be measured H is further changed by −θF, by transmitting through the Faraday rotator 52 again, the left rotating circularly polarized light is changed to a third linearly polarized wave CW2 which is P-polarized light by transmitting through the ¼ wave plate 51 again, and the third linearly polarized wave CW2 is emitted to the PBS 42B (arrow 113). The total phase shift at the magnetic field sensor element 50A and 50B is −4θF.

The third straight line polarized wave CW2 is incident on the phase adjusting element 45 in the second optical path 44 through the PBS 42B (direction of arrow 114). In the phase adjusting element 45, the third linearly polarized wave CW2 is changed to left rotating circularly polarized light (arrow 115), the phase thereof is changed by −45 degrees, and the left rotating circularly polarized light is changed to P-polarized light (arrow 116), by transmitting in order through the ¼ wave plate 47, 45 degrees Faraday rotator 48 and ¼ wave plate 46. The third straight line polarized wave CW2 transmitted through the phase adjusting element 45 is changed to S-polarized light through the PBS 41 (direction of arrow 117), and the S-polarized light is emitted to the ½ wave plate 30.

On the other hand, the second linearly polarized wave CCW1 is changed to P-polarized light through the PBS 41, the P-polarized light is incident on the second optical path 44 (direction of arrow 204), and is incident on the phase adjusting device 45. In the phase adjusting element 45, the second linearly polarized wave CCW1 is changed to left rotating circularly polarized light (arrow 205), the phase thereof is 45 degrees changed, and the left rotating circularly polarized light is changed to P-polarized light (arrow 206), by transmitting the ¼ wave plate 46, the 45 degrees Faraday rotator 48 and ¼ wave plate 47 in the order.

The second linearly polarized wave CCW1 transmitted through the phase adjusting element 45 is incident on the magnetic field sensor element 50B through the PBS 42B (direction of arrow 207). The second linearly polarized wave CCW1 incident on the magnetic field sensor element 50B is changed to a left rotating circularly polarized wave by transmitting through the ¼ wave plate 51 (direction of arrow 208), the phase in accordance with a measured magnetic field H is changed by θF, by transmitting through the Faraday rotator 52, the left rotating circularly polarized wave is changed to right rotating circularly polarized light by reflecting on the mirror element 53 (arrow 209), the phase in accordance with the measured magnetic field H is further changed by θF, by transmitting through the Faraday rotator 52 again, and the right rotating circularly polarized light is changed to S-polarized light by transmitting through the ¼ wave plate 51 again, and the S-polarized light is emitted to the PBS 42B (arrow 210). The total phase shift at the magnetic field sensor element 50B is 2θF.

Return light from the magnetic field sensor element 50B is changed to P-polarized light through the PBS 42B (direction of arrow 211), the P-polarized light is changed to S-polarized light again through the PBS 42A, and the S-polarized light is incident on the magnetic field sensor element 50A (arrow 212). The S-polarized light incident on the magnetic field sensor element 50A is changed to right rotating circularly polarized light by transmitting through the ¼ wave plate 51 (direction of arrow 213), the phase in accordance with the measured magnetic field H is changed by θF, by transmitting through the Faraday rotator 52, the right rotating circularly polarized light is changed to left rotating circularly polarized light by reflecting on the mirror element 53 (arrow 214), the phase in accordance with the measured magnetic field H is further changed by θF, by transmitting through the Faraday rotator 52 again, the left rotating circularly polarized light is changed to a fourth linearly polarized wave CCW2 which is P-polarized light by transmitting through the ¼ wave plate 51, and the fourth linearly polarized wave CCW2 is emitted to the PBS 42A (arrow 215). The total phase shift at the magnetic field sensor elements 50A and 50B is 4θF.

The fourth straight line polarized wave CCW2 is incident on the first optical path 43 through the PBS 42A (direction of arrow 216), and is emitted to the ½ wave plate 30 through the PBS 41 (arrow 217). The third linearly polarized wave CW2 and the fourth linearly polarized wave CCW2 is synthesized by the PBS 41, the polarization plane thereof is rotated by 45 degrees, by transmitting through the ½ wave plate 30, the light is changed to light having a P polarization component and the S polarization component, respectively (arrows 118 and 218), branched by the circulator 20, and incident on the PBS 61 (arrows 119 and 219). The S polarization component of the light synthesizing the third straight line polarized wave CW2 and the fourth linearly polarized wave CCW2 is incident on the first light receiving element 62 (directions of arrows 120 and 220), the P polarization component thereof is incident on the second light receiving element 63 (arrows 121 and 221), respectively through the PBS 61. In the sensor device 1, a clockwise polarization Ecw and a counterclockwise polarization Eccw are separated into two paths in the PBS 41, each, the clockwise polarization Ecw and the counterclockwise polarization Eccw is interfered with each other when passing through the ½ wave plate 30, after passing through two magnetic field sensor elements.

In the sensor device 1, each of the magnetic field sensor elements in the same optical system may be disposed on the front and back side of a measured conductor, respectively, and therefore, magnetic fields on the front and back sides of the measured conductor may be simultaneously measured. Since the relative position of the two magnetic field sensor elements is fixed, when one of the two magnetic field sensor elements is close to a measured conductor, the other thereof gets away at the same distance from the measured conductor, and the Faraday rotation angle caused by light transmitted through the two magnetic field sensor elements is a sum of rotation angles of the individual magnetic field sensor elements. Thus, in the sensor device 1, a measured value obtained without depending on a distance between magnetic field sensor elements and a measured conductor, the accuracy of a detected magnetic field amount is improved as compared with a sensor device magnetic field sensor device having only one magnetic field sensor element disposed on one side of a measured conductor. Further, even if the order of the frequency of the current flowing through the measured conductor is in GHz, the sensor device 1 may measure a magnetic field on a measured conductor, and therefore the sensor device 1 may measure a current having higher frequency as compared with a sensor device for measuring a magnetic field on a measured conductor surrounding by a magnetic yoke composed of a ferrite magnetic material.

Figure 6A:
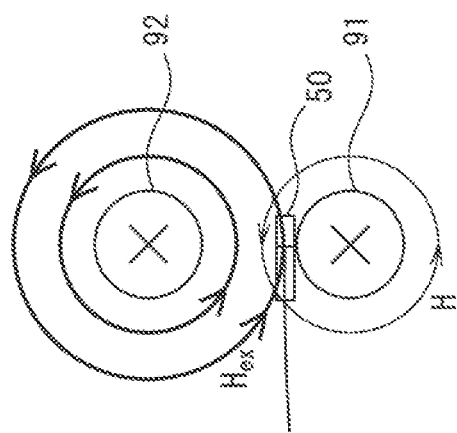
FIG. 6A is diagrams for explaining a influence of the external magnetic field on a measured value.
Figure 6B:
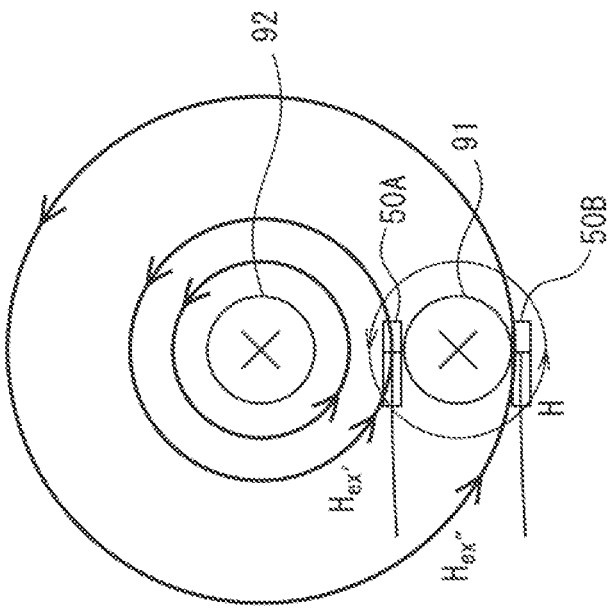
FIG. 6B is diagrams for explaining a influence of the external magnetic field on a measured value.

FIGS. 6A and 6B are diagrams for explaining a influence of the external magnetic field on a measured value. FIGS. 6A and 6B show a measurement of a magnetic field (a measured magnetic field) H on a measured conductor 91 which is a current path under an environment where an outer conductor 92 is disposed near the measured conductor 91. FIG. 6A shows that one magnetic field sensor element 50 is disposed, and FIG. 6B shows that two magnetic field sensor elements 50A and 50B are disposed in the sensor device 1. In the example figures, the magnetic field sensor element 50 is disposed parallel to a measured magnetic field H by contacting the measured conductor 91, and the magnetic field sensor elements 50A and 50B are disposed parallel to a measured magnetic field H by sandwiching the measured conductor 91 from both sides thereof. An external magnetic field Hex around the measured conductor 91 is uniform (i.e., external magnetic fields Hex' and Hex" applied to the magnetic field sensor elements 50A and 50B are equal).

If one magnetic field sensor element is disposed, when an orientation of the external magnetic field Hex is parallel to that of the magnetic field sensor element 50 as shown in FIG. 6A, the external magnetic field Hex may increase the measured magnetic field H, or may cancel the measured magnetic field H, and therefore the external magnetic field Hex particularly affects measurement. On the other hand, when two magnetic field sensor elements are disposed as shown in FIG. 6B, the external magnetic field Hex' cancels the measured magnetic field H in one magnetic field sensor element 50A, whereas the external magnetic field Hex" increases the measured magnetic field H in the other magnetic field sensor element 50B. Thus, in the sensor element 1, the effect of the external magnetic field Hex to measured value may be cancelled, since an averaging effect of is obtained by taking the sum of the outputs from the magnetic field sensor elements 50A and 50B. When external magnetic fields Hex' and Hex" in the two magnetic field sensor elements are different each other, although an effect of the external magnetic field Hex is not completely canceled, the resistance to disturbance is increased as compared with the sensor device which includes a single magnetic field sensor element disposed only one position on the side of a measured conductor.

Further, in the sensor device 1, since a detected signal Ed is generated by inverting and amplifying the differential signal (E1–E2) between the first electric signal E1 and the second electric signal E2, the DC component corresponding to the reference light intensity is removed from the detected signal Ed, and therefore the signal-to-noise ratio of the detected signal Ed is increased.

Figure 7:
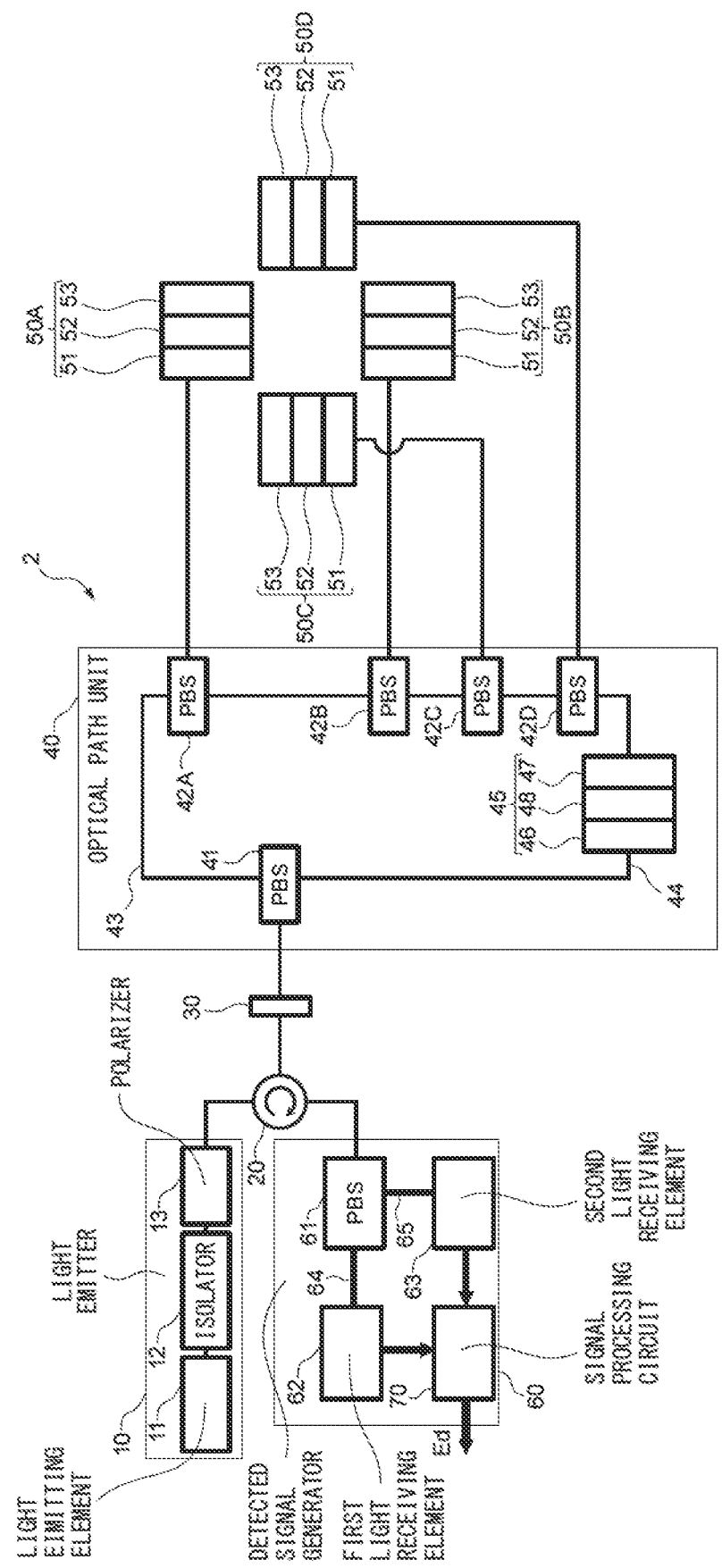
FIG. 7 is a block diagram of a sensor device 2.

FIG. 7 is a block diagram of a sensor device 2. The sensor device 2 is an example of an interference-type optical magnetic field sensor device, the PBSs 42C and 42D and magnetic field sensor elements 50C and 50D are added thereto, it is an only different from the sensor device 1 that four magnetic field sensor elements are disposed. Components of the sensor device 2 other than the PBSs 42C and 42D and the magnetic field sensor elements 50C and 50D are all the same as those of the sensor device 1. The PBSs 42C and 42D are polarizing beam splitters having the same function as the PBSs 42A and 42B, the magnetic field sensor elements 50C and 50D are the same element as the magnetic field sensor elements 50A and 50B. The PBSs 42A to 42D are connected to each other in the order between the first optical path 43 and the second optical path 44 by polarization maintaining fibers such as PANDA fibers, and are connected to corresponding magnetic field sensor elements 50A to 50D through polarization maintaining fibers, respectively.

The magnetic field sensor elements 50A to 50D are disposed in a positional relationship of 90 degrees to each other in the four sides of a measured conductor (the current path shown by reference numeral I in FIGS. 8 and 9), so that the magnetic field sensor elements 50A and 50B are one pair, and the magnetic field sensor elements 50C and 50D are another pair. The magnetic field sensor elements as a pair are disposed in the same orientation across a measured conductor (opposite to each other with respect to a measured magnetic field H), similar to the example shown in FIG. 6B, in order to cancel influences of the external magnetic field. At least the relative position between the magnetic field sensor elements as a pair is fixed, and therefore the distance therebetween is invariant. The four magnetic field sensor elements 50A to 50D are integrally formed at a constant distance from each other, it is preferable that the relative positions thereof are fixed.

In the sensor device 2, the first linearly polarized wave CW1 is incident on the magnetic field sensor element 50A through the PBS 42A, return light thereof is incident on the magnetic field sensor element 50B through the PBSs 42A and 42B, return light thereof is incident on the magnetic field sensor element 50C through the PBSs 42B and 42C, return light thereof is incident on the magnetic field sensor element 50D through the PBSs 42C and 42D, and the return light thereof is emitted through the PBS 42D as a third linearly polarized wave CW2. Further, the second linearly polarized wave CCW1 is incident on the magnetic field sensor element 50D through the PBS 42D, return light thereof is incident on the magnetic field sensor element 50C through the PBSs 42D and 42C, the return light thereof is incident on the magnetic field sensor element 50B through the PBSs 42C and 42B, the return light thereof is incident on the magnetic field sensor element 50A through the PBSs 42B and 42A, and the return light thereof is emitted through the PBS 42A as a fourth linearly polarized wave CCW2.

In the sensor device 2, the S polarization component and the P polarization component of the third straight line polarized wave CW2 incident on the detected signal generator 60 is represented by the ECW of the following equation, the S polarization component and the P polarization component of the fourth linearly polarized wave CCW2 is represented by ECCW of the following equation. The S polarization component and P polarization component of light synthesizing the third linearly polarized wave CW2 and the fourth linearly polarized wave CCW2, except that 4θF is changed to 8θF, the above equation (1) is the same as P0 and P90 of (2).

$$E_{CW} = \frac{1}{\sqrt{2}} \begin{pmatrix} e^{j(8\theta_F - 45°)} \\ e^{j(8\theta_F - 45°)} \end{pmatrix} \quad \text{[Formula 3]}$$

$$E_{CCW} = \frac{1}{\sqrt{2}} \begin{pmatrix} e^{-j(8\theta_F + 135°)} \\ e^{-j(8\theta_F - 45°)} \end{pmatrix}$$

Figure 8:
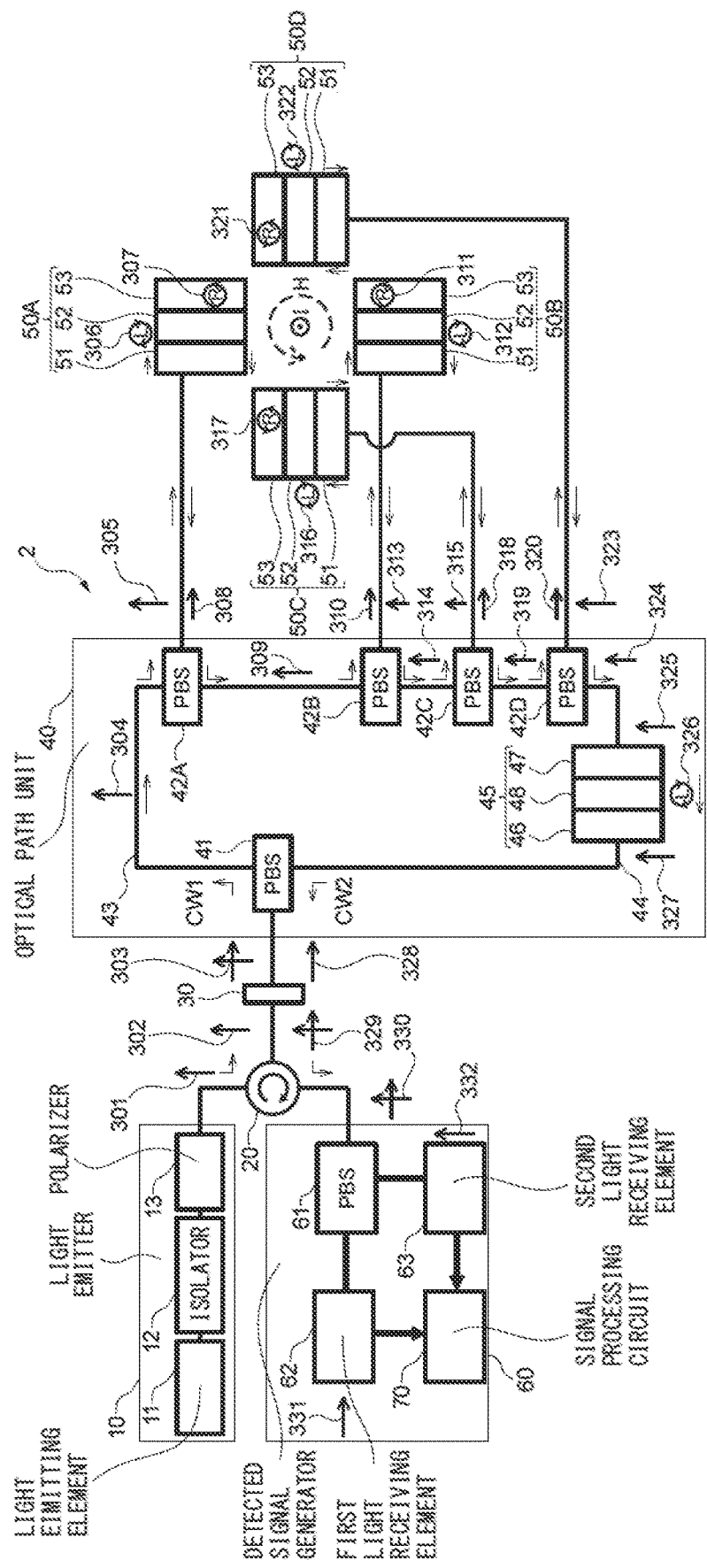
FIG. 8 is diagrams for explaining the operations of the sensor device 2.
Figure 9:
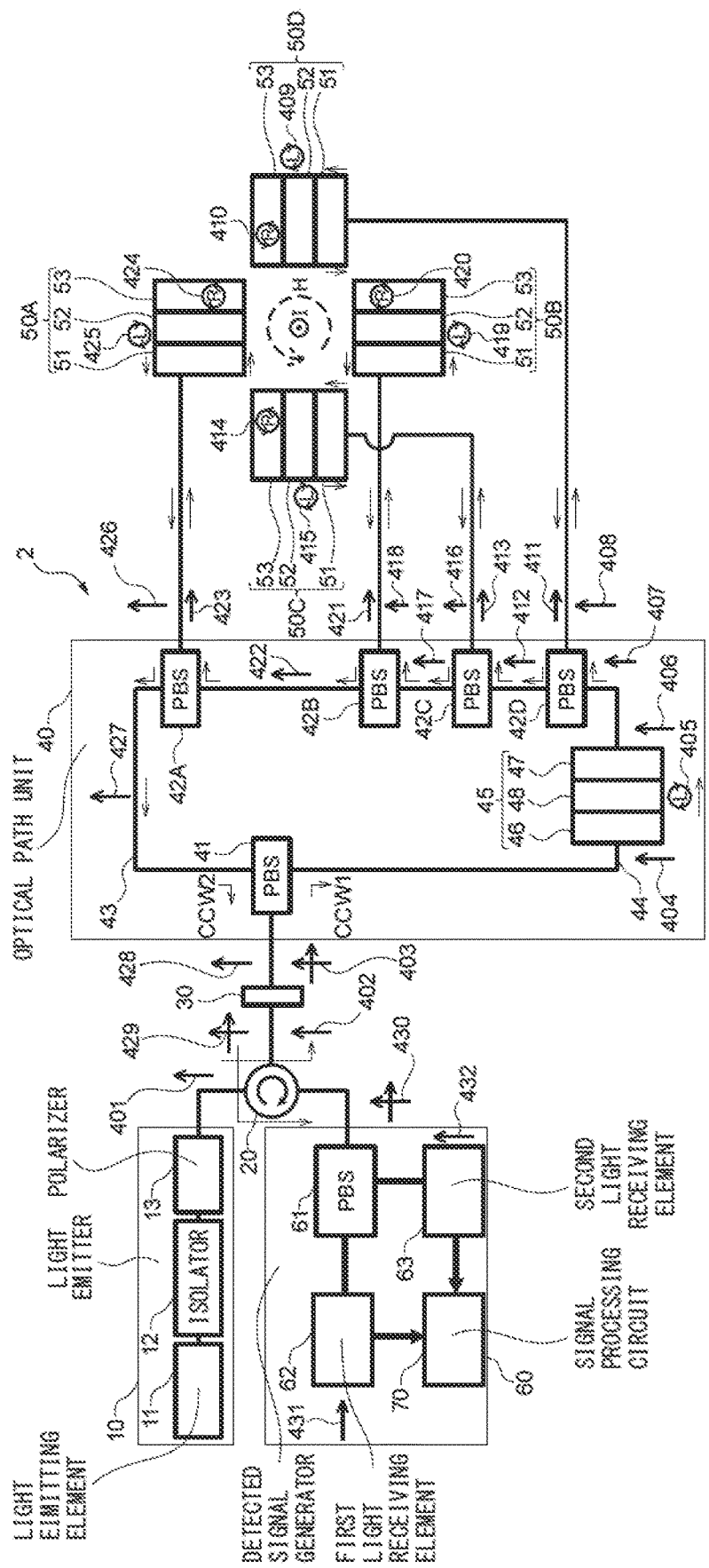
FIG. 9 is diagrams for explaining the operations of the sensor device 2.

FIGS. 8 and 9 are diagrams for explaining the operation of the sensor device 2. Thin arrows in FIGS. 8 and 9 indicate light propagation directions, and thick arrows 301-332 in FIG. 8 and the thick arrows 401-432 in FIG. 9 indicate polarization states at each of locations. Since operations of the sensor device 2 are the same as those of the sensor device 1 except that the number of passing PBSs and magnetic field sensor elements is increased, duplicated descriptions will be omitted.

Operations from an operation in which the first linearly polarized light which is P-polarized light is firstly emitted from the polarizer 13 in the light emitter 10, to an operation in which the first linearly polarized light is changed to light having a first linearly polarized wave CW1, which is P-polarized light, and a second linearly polarized wave CCW1, which is S-polarized light, and is incident on the PBS41 (arrows 301 to 303, 401 to 403) are the same as the operations indicated by arrows 101 to 103 and 201 to 203 in FIGS. 4 and 5. Operations from an operation in which the first linearly polarized wave CW1 is incident on the first optical path 43 through the PBS 41, to an operation in which the first linearly polarized wave CW1 is emitted from the PBS 42B through the magnetic field sensor elements 50A and 50B (arrows 304 to 314) is the same as the operations indicated by arrows 104 to 114 in FIG. 4. Operations in which return light from the magnetic field sensor element 50B is further emitted to the ½ wave plate 30 as the third linearly polarized wave CW2 through the magnetic field sensor elements 50C and 50D, the phase adjusting element 45 and the PBS 41 (arrows 315 to 328) is the same as the operations indicated by arrows 105 to 117 in FIG. 4.

Operations from an operation in which the second linearly polarized wave CCW1 is incident on the second optical path 44 through the PBS 41, to an operation in which the second linearly polarized wave CCW1 is emitted from the PBS 42C through the phase adjusting element 45, the magnetic field sensor elements 50D and 50C (arrows 404 to 417) is the same as the operations indicated by arrows 204 to 216 in FIG. 5. Operations in which return light from the magnetic field sensor element 50C is further emitted to the ½ wave plate 30 as the fourth linearly polarized wave CCW2 through the magnetic field sensor elements 50B and 50A and the PBS 41 (arrows 418 to 428) are the same as the portion of arrows 207 to 217 in FIG. 5. Operations from an operation in which the third straight line polarized wave CW2 and the fourth linearly polarized wave CCW2 are synthesized by PBS41 and transmitted through the ½ wave plate 30, to an operation in which the light is incident on the first light receiving element 62 and the second light receiving element 63 (arrows 329 to 332 and 429 to 432) are the same as the operations indicated by arrows 118 to 121 and 218 to 221 in FIGS. 4 and 5.

Sensor device 2 may obtain measured values without depending on a distance between the magnetic field sensor elements and a measured conductor, the accuracy of the detected magnetic field amount is further improved than that of the sensor device 1, since the number of the magnetic field sensor element disposed around a measured conductor is larger that of the sensor device 1. Further, similarly to the sensor device 1, the sensor device 2 may measure a magnetic field, even if the frequency of the current is in the order of GHz, the resistance to disturbance is strong, and a SN ratio of a detected signal Ed is increased.

Furthermore, more magnetic field sensor elements such as six and eight may be provided so as to surround the periphery of a measured conductor at an equal angle. As described as directions of arrows 408, 413, 418 and 423 in FIG. 8 and the arrows 305, 310, 315 and 320 in FIG. 9, since when light incident on the magnetic field sensor element passes through the PBS, light incident on the magnetic field sensor element is alternately replaced between P-polarized light and S-polarized light, the number of the magnetic field sensor element may be an even number (2n pieces).

Figure 10:
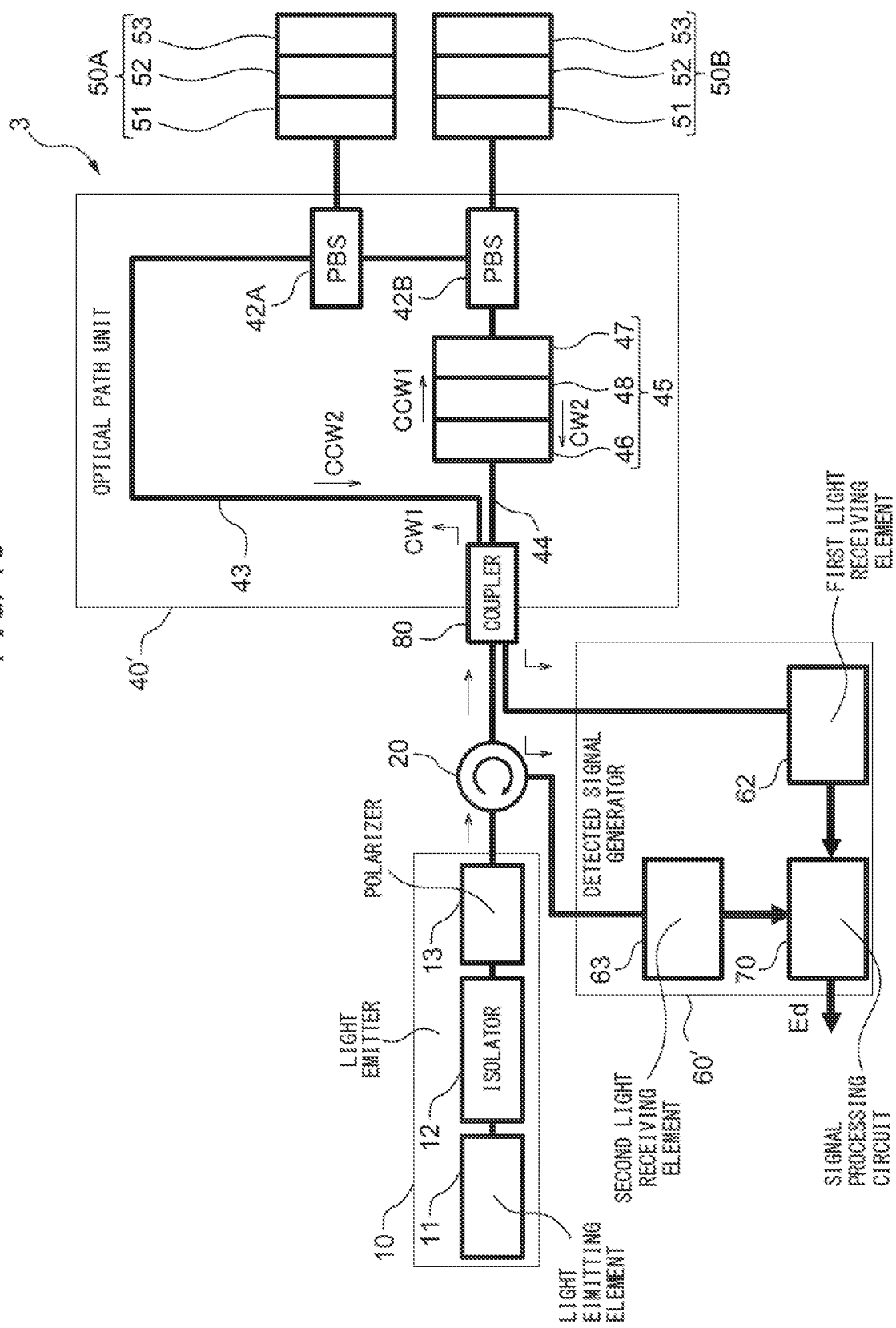
FIG. 10 is a block diagram of a sensor device 3.

FIG. 10 is a block diagram of a sensor device 3. The sensor device 3 is an example of an interference type optical magnetic field sensor device, is different from the sensor device 1 only in that ½ wavelength plate 30 is replaced to a coupler 80, the optical path 40 is replaced to a optical path 40', and the detected signal generator 60 is replaced to a detected signal generator 60'. In the sensor device 3, the optical path 40 1 is different from the optical path 40 of the sensor device 1 only in that no PBS 41 is disposed, and therefore the first optical path 43 and the second optical path 44 are directly connected to the coupler 80, and the coupler 80 has a function of the PBS 41. The detected signal generator 60' is different from the detected signal generator 60 of the sensor device 1 in that the detected signal generator 60' includes no PBS 61, the first light receiving element 62 is directly connected to the coupler 80, and the second light receiving element 63 is directly connected to the circulator 20.

The coupler 80 is an example of a first optical element, separates the first linearly polarized light incident from the circulator 20 to the first linearly polarized wave CW1 and the second linearly polarized wave CCW1, the first linearly polarized wave CW1 is emitted to the first optical path 43, and the second linearly polarized wave CCW1 is emitted to the second optical path 44, respectively. Further, the third straight line polarized wave CW2 and the fourth linearly polarized wave CCW2 which is returned light from the magnetic field sensor elements 50A and 50B are incident from the optical path 40', the coupler 80 separates the second linearly polarized light consisting of those light into two components, and emits to the first light receiving element 62 and the circulator 20.

In the sensor device 3, the first linearly polarized light, which is P-polarized light, is emitted from the polarizer 13 in the light emitter 10, passes through the circulator 20 and is incident on the coupler 80, and is separated into the first linearly polarized wave CW1 and the second linearly polarized wave CCW1 by the coupler 80. The first linearly polarized wave CW1 and the second linearly polarized wave CCW1 are both P-polarized light, transmitted through the optical path 40' and the magnetic field sensor elements 50A and 50B similar to the sensor device 1, and are incident on the coupler 80 again as the third straight line polarized wave CW2 and the fourth linearly polarized wave CCW2, which are both P-polarized light. The polarization states in middle operations are the same as those of the sensor device 1 indicated by arrows 104 to 116 in FIG. 4 and arrows 204 to 216 in FIG. 5.

The second linearly polarized light consisting of the third linearly polarized wave CW2 and the fourth linearly polarized wave CCW2 is emitted from the coupler 80 to the first light receiving element 62 and the circulator 20, is received by the first light receiving element 62 and the second light receiving element 63. The coupler 80 is equivalent to a half mirror, since when light is transmitted through a half mirror, phase of the light is changed by 90 degrees, and when light is reflected by a half mirror, phase of the light is changed by 180 degree, the light incident on the first light receiving element 62 consists of the reflected light of the third linearly polarized wave CW2 (180 degrees) and the transmitted light of the fourth linearly polarized wave CCW2 (90 degrees). Further, the light incident on the second light receiving element 63 includes a transmitted light of the third linearly polarized wave CW2 (90 degrees), and a reflected light of the fourth linearly polarized wave CCW2 (180 degrees).

Thus, in the sensor device 3, a clockwise polarization Ecw and the counterclockwise polarization Eccw are separated into two paths by the coupler 80, each passes through two magnetic field sensor elements, and interferes with each other when returned to the coupler 80 again.

Therefore, in the sensor device 3, light intensities PD1 and PD2 of the interfering light in the first light receiving element 62 and the second light receiving element 63 is expressed as follows. ECW,R,ECCW,T,ECW,T,ECCW and R indicate the reflection light of the third straight line polarized wave CW2 at the coupler 80, the transmission light of the fourth linearly polarized wave CCW2, the transmitted light of the third linearly polarized wave CW2, and the reflected light of the fourth linearly polarized wave CCW2, respectively.

$$PD1 = |E_{CW,R} + E_{CCW,T}|^2 \alpha \sin^2(4\theta_F + 45°)$$

$$PD2 = |E_{CW,T} + E_{CCW,R}|^2 \alpha \sin^2(-4\theta_F - 135°) \qquad \text{[Formula 4]}$$

Thus, operating points of PD1 and PD2 are points which phase difference is relatively shifted by 180 degrees. In other words, when the Faraday effect occurs in the magnetic field sensor elements 50A and 50B, the light intensity changes of PD1 and PD2 are reciprocal to each other, symmetrically changes with respect to the same light intensity. Therefore, the interference light in the first light receiving element 62 and the second light receiving element 63 is converted to electric signals, and inputs the difference thereof to the signal processing circuit 70 so that the DC component corresponding to the reference light intensity is removed, and a SN ratio of the detected signal Ed is increased. Further, since the sensor device 3 includes two magnetic field sensor elements, measured values may be obtained without depending on a distance between the magnetic field sensor elements and a measured conductor, and the accuracy of the detected magnetic field amount is improved.

What is claimed is:

1. An interference type optical magnetic field sensor device, comprising:
    a light emitter configured to emit a first linearly polarized light;
    a first optical element configured to emit a first linearly polarized wave and a second linearly polarized wave in response to the first linearly polarized light incident on the first optical element, and emit a second linearly polarized light in response to a third linearly polarized wave and a fourth linearly polarized wave incident on the first optical element;
    at least one pair of light transmissive magnetic field sensor elements to be disposed within a magnetic field across the measured conductor, configured to change the phase of transmitted light in accordance with the magnetic field, and fixing a relative position therebetween;
    an optical path including a first optical path configured to propagate the first linearly polarized wave and the fourth linearly polarized wave, and a second optical path configured to propagate the second linearly polarized wave and the third linearly polarized wave, wherein the optical path is connected to the first optical element and the magnetic field sensor elements;
    a detected signal generator configured to output a detected signal corresponding to the magnetic field, by receiving two components of the second linearly polarized light, and convert to the electrical signal; and
    an optical branching element configured to transmit the first linearly polarized light to the first optical element and branch the second linearly polarized light to the detected signal generator, wherein
    when the first linearly polarized wave is incident on one of the magnetic field sensor elements, the one emits first return light, and when second return light is incident on one of the magnetic field sensor elements, the one emits the fourth linearly polarized wave, and
    when the first return light is incident on the other of the magnetic field sensor elements, the other emits the third straight line polarized wave, and when the second linearly polarized wave is incident on the magnetic field sensor element, the other emits the second return light.

2. The interference type optical magnetic field sensor device according to claim 1, wherein the optical path further includes a second optical element disposed in the second optical path, and the second optical element adjusting adjusts the phase of the second linearly polarized wave and the third linearly polarized wave so that the phase difference between the third linearly polarized wave and the fourth linearly polarized wave is 90 degrees.

3. The interference type optical magnetic field sensor device according to claim 1, wherein the first optical element is a ½ wave plate disposed so that the polarization plane azimuth angle of the first linearly polarized light is 22.5 degrees, and
    the detected signal generator receives the second linearly polarized light incident from the optical branching element, and separates the second linearly polarized light into S polarization component light and P polarization component.

4. The interference type optical magnetic field sensor device according to claim 1, wherein the first optical element is a coupler configured to emit the first linearly polarized light by separating the first linearly polarized wave into a first linearly polarized wave, and the second linearly polarized light, and emit the second linearly polarized light, by separating the second linearly polarized light into the two components, and
    one of the two components is incident from the first optical element to the detected signal generator, and the other of the two components are incident from the optical branching element to the detected signal generator.

5. The interference type optical magnetic field sensor device according to claim 1, wherein the light emitter, the optical branching element, the first optical element, the optical path, the magnetic field sensor element and the detected signal generator are connected to each other by polarization maintaining fibers.

* * * * *